United States Patent [19]

Sibbald et al.

[11] Patent Number: 5,306,912
[45] Date of Patent: Apr. 26, 1994

[54] OPTICALLY ADDRESSED THERMAL IMAGING DEVICE

[75] Inventors: Alastair Sibbald, Maidenhead; Brian Holcroft, High Wycombe; Elvin Nix, Windsor; Stanley Taylor, Sunbury-on-Thames all of England

[73] Assignee: Thorn EMI plc, London, United Kingdom

[21] Appl. No.: 605,172

[22] Filed: Oct. 11, 1990

[30] Foreign Application Priority Data

Oct. 21, 1989 [GB] United Kingdom ............... 89237671

[51] Int. Cl.$^5$ .......................... G02B 26/10; G01J 5/00; H01L 27/14
[52] U.S. Cl. .................... 250/334; 250/338.3; 357/30; 365/112; 348/165; 257/431
[58] Field of Search ............ 358/113; 250/338.3, 250/334; 357/30 D, 30 H, 30 Q, 30 R; 365/112

[56] References Cited

U.S. PATENT DOCUMENTS 4,142,206 2/1979 Ennulat ................... 358/113

4,250,567 2/1981 Brody ................... 365/109
4,782,227 11/1988 Micheron et al. ........ 365/109 X

FOREIGN PATENT DOCUMENTS 2163596 2/1986 United Kingdom .

Primary Examiner—Stephen C. Buczinski
Attorney, Agent, or Firm—Keck, Mahin & Cate

[57] ABSTRACT

A thermal imaging device includes detector pixels A, B, C provided by a pyroelectric layer 1 arranged between electrode structures 3 and 4. A photoconductive layer 7 is provided between the electrode structure 5 and a further electrode structure 9. The device also includes an illumination source 11 for illuminating the photoconductive layer 7 for enabling pyroelectric charge developed by the detector pixels A, B, C to be optically addressed via the electrode structure 9. Optical addressing of the detector pixels obviates the need for solid state switching connections to each pixel, providing an imaging device readily capable of large scale fabrication.

16 Claims, 4 Drawing Sheets

Incoming Infrared radiation

Incoming Infrared radiation

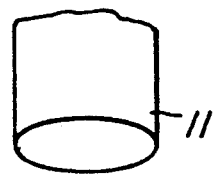
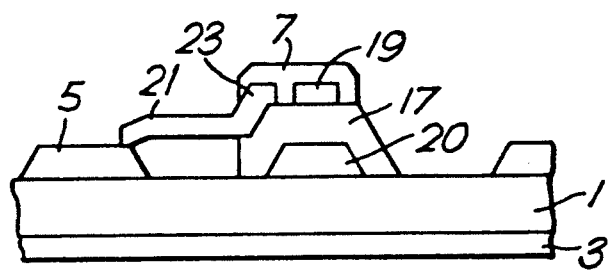
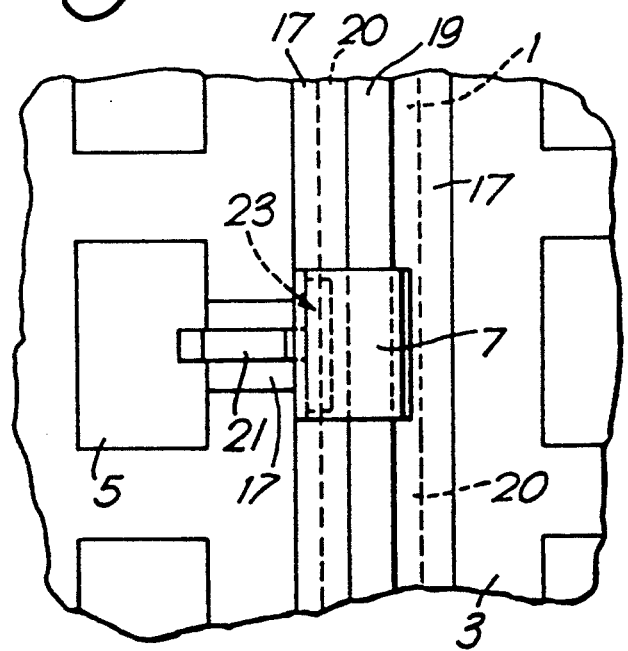

OPTICALLY ADDRESSED THERMAL IMAGING DEVICE

This invention relates to thermal imaging devices and in particular to means for accessing information generated and stored by such devices.

A number of thermal imaging devices incorporating a layer of pyroelectric material have been proposed, one example being disclosed in U.K. Patent 2,163,596. In the device described in this patent, a pyroelectric slab bears a common electrode on one main surface and a discrete electrode structure on the opposite main surface. This structure defines an array of discrete detector pixels. Each pixel is connected to the electrodes of a circuit substrate by means of respective electrical conductors.

The discrete electrodes are serially addressed in order to electrically interrogate the device. This serial addressing thus requires an individual permanent electrical connection to be made to each discrete electrode together with suitable switching means for switching between the pixels. Such connections reduce the thermal isolation of each pixel and may add to the overall thermal mass of the device, both these factors acting to reduce the signals generated by the device. Also, because the pyroelectric signals are very small and need to be switched rapidly using, for example, MOSFETs, complicated integrated circuitry needs to be employed. Furthermore in such conventional, transistor-switched, pyroelectric detector arrays, each pixel buffer and switching circuit possesses an intrinsic offset voltage which can differ markedly from one pixel to the next. This precludes simple analogue filtering of the switched output signal, because of the large step-changes in output voltage which would be caused by the sequential switching of the relatively large individual offsets to the output bus which connects the collector electrode of the MOSFETs.

It is an object of the present invention to provide a thermal imaging device in which the above shortcomings are at least alleviated.

According to the present invention there is provided a thermal imaging device comprising a pyroelectric layer arranged between first and second electrode structures to define an array of pyroelectric detector pixels, photoconductive means for electrically coupling one of the first and second electrode structures with a further electrode structure, and illumination means for illuminating the photoconductive means for enabling pyroelectric charge developed by pyroelectric detector pixels to be addressed via the further electrode structure.

Thus by including means for optically addressing the pyroelectric detector pixels, a device in accordance with the present invention has the advantage over prior art devices in that the provision of individual metallic electrical switching connections to every pixel, together with suitable switching means, is avoided. For this reason, and that the device is not required to be hybridized directly with a silicon integrated circuit, the device is thus more readily capable of large-scale fabrication having relatively large dimensions and incorporating a large number of pixels.

The device is also more efficient than prior art devices which are totally electrically addressed. Other than the pyroelectric pixels themselves, the photoconductive layer is the only noise source associated with each individual pixel. Also, there is no variation in inter-pixel responsivity owing to inter-MOSFET variations in transconductance as is manifest in prior art devices where each pixel possesses a dedicated FET buffer.

Advantageously, the illumination means may include a light source for providing intermittent emission of light and scanning means for scanning light emitted from the light source over the photoconductive means for selectively controlling the illumination of the photoconductive means for enabling an individual detector pixel to be addressed via the further electrode structure.

The device may include a screening means incorporating opaque regions for selectively controlling the illumination of the photoconductive means for enabling an individual detector pixel to be addressed via the further electrode structure. This screening technique is effective to eliminate the possibility of creating lateral electrically conductive pathways between the pixels in the photoconductive layer.

Preferably, the screening means constitutes the third electrode structure.

Preferably the photoconductive means comprises an array of frame structures of photoconductive material, each frame structure arranged to at least partially surround a respective detector pixel, and the further electrode structure comprises a matrix of electrode frame structures each arranged to at least partially surround a respective detector pixel and complement a frame structure of photoconductive material, the further electrode structure incorporating interconnect portions, having a width substantially less than that of the electrode frame structures, for providing interconnects between adjacent electrode frame structures.

The interconnect portions may be configured to provide electrode frame structures arranged in rows and the illumination means is arranged to scan in a manner so as to simultaneously illuminate a plurality of frame structures of photoconductive material each complementing an electrode frame structure in a different row for enabling a plurality of detector pixels to be addressed simultaneously by the illumination means.

This allows simultaneous addressing of a plurality of pixels rather than single pixels and hence more efficient image processing is possible.

By employing such frame type structures reductions in thermal mass, crosstalk and interpixel parasitic capacitance may be achieved.

In a preferred embodiment the one electrode structure overlies first regions of the pyroelectric layer and the photoconductive means and the further electrode structure are arranged to overlie further regions of the pyroelectric layer, spaced from the first regions, the device further comprising electrical conductors, spaced from the pyroelectric layer, for providing an electrical path between the said one and the further electrode structure, and a grounding electrode structure, isolated electrically from the further electrode structure and arranged between the further electrode structure and the pyroelectric layer for capacitively isolating the further electrode structure from the pyroelectric layer.

Moreover, the one electrode structure may comprise a plurality of discrete electrodes arranged as an array of rows and columns on a major surface of the pyroelectric layer, the further electrode structure and the grounding electrode structure each comprising a respective plurality of elongate strip electrodes, each elongate strip further electrode being arranged to overlie an elongate strip grounding electrode and spaced therefrom by an electrical insulator layer, and wherein the photoconductive means comprises a plurality of discrete regions of photoconductive material, each respective to a discrete electrode of said one electrode structure and connected thereto by a said electrical conductor, the regions of photoconductive material overlying the elongate strip further electrodes.

The means for illumination may include a matrix of liquid crystal display elements for controlling the illumination of the photoconductive means by the illumination means.

Preferably, the thermal imaging device incorporates chopping means for chopping, at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

Embodiments of a thermal imaging device in accordance with the present invention will now be described, by way of example only, with reference to the accompanying drawings of which:

FIG. 6 shows a plan view of part of a fourth thermal imaging device in accordance with the present invention;

FIG. 7 shows a schematic cross-sectional view of part of the device shown in FIG. 6;

Figure 1:
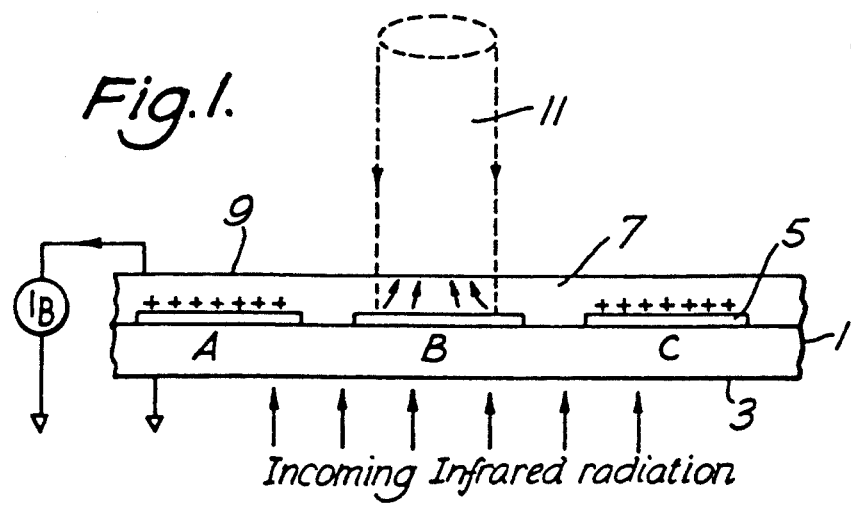
FIG. 1 shows a schematic cross-sectional view of part of a first thermal imaging device in accordance with the present invention.

Referring to FIG. 1, the first device includes a pyroelectric layer of pyroelectric material 1 such as the ceramic lead-lanthanum-zirconium-titanate (PLZT) or the organic material polyvinylidene fluoride (PVD) sandwiched between a continuous electrode structure 3 and a discrete electrode structure 5. The continuous electrode structure 3 is made of a resistive material such as a NiCr film and is or forms part of an infra-red radiation absorber. The discrete electrode structure 5 comprises a patterned gold film. The two electrode structures 3, 5 and the pyroelectric layer 1 thus define an array of pyroelectric detector pixels. By appropriate selection of the metal sheet restivities, and the thickness and refractive index of the pyroelectric layer, each pixel can be engineered so as to possess a high infra-red radiation absorption coefficient. Only three such pixels A, B, C are shown in FIG. 1, although it will be appreciated that such a thermal imaging device will typically incorporate an array of 100×100 pixels or more.

Over the array of discrete electrodes 5 lies a layer of photoconductive material 7, for example cadmium sulphide. Over this photoconductive layer 7 is provided an upper, transparent "collector" electrode such as a very thin gold film 9 or a thin film of indium tin oxide (ITO).

In use of the device incoming infra-red radiation from an object to be imaged (not shown) falls on to the continuous electrode structure 3 and is largely absorbed by the combined electrode and pyroelectric layer structure (3, 1, 5), thus heating the pyroelectric pixels A, B, C. A charge is thus generated between the electrodes 3, 5 which is proportional to the change in temperature of the pixels A,B,C.

The pyroelectric charge thus generated is transferred to the collector electrode 9 by means of the illumination of successive regions of the photoconductive layer 7 overlying each pixel by a collimated light beam 11, as shown in FIG. 1 for pixel B. This causes a current, $i_B$ to flow in an external circuit which may be amplified and used to drive a read-out display as will be described later.

The light beam 11 is scanned over each pixel in turn, transferring the pixel charge sequentially to the external circuit. Thus optical addressing removes the need for permanent electric connections between the detector and a silicon chip at every pixel.

Figure 2:
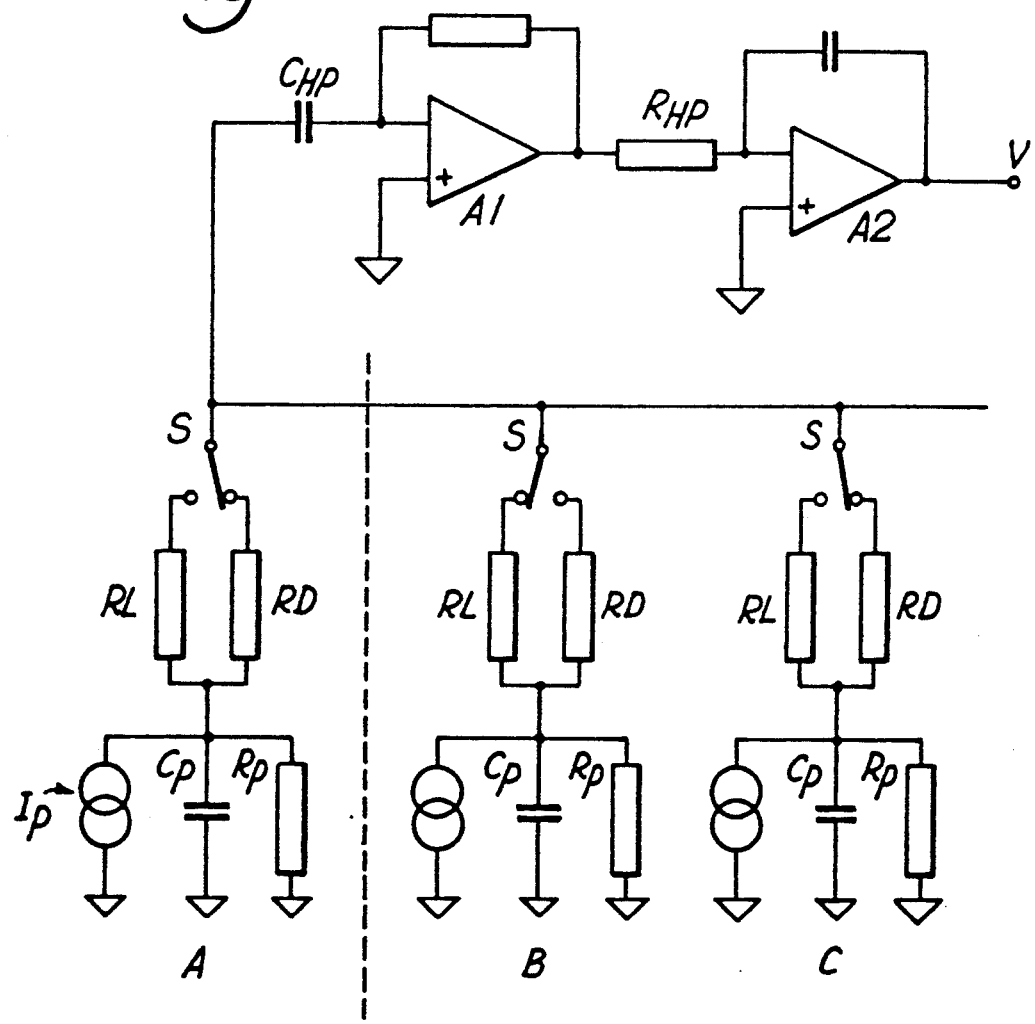
FIG. 2 is a schematic equivalent circuit for the first device.

Referring now also to FIG. 2, each pixel A, B, C may be represented by a current source Ip connected in parallel with a capacitor Cp representing the capacitance of the A, B or C, and a resistor Rp representing the resistance of the pixel A, B or C. The photoconductive layer 7 is represented by switches S effective to switch between a low resistance current path RL when the region of the photoconductive layer 7 corresponding to the pixel A, B or C is being illuminated, and a high resistance current path RD when the particular region is not being illuminated.

A capacitor C(HP) removes the low frequency "dark" noise, i.e. the steady d.c. drift caused by the integration of the current leaking through the resistors RD. The optically switched device and circuit, however, will have a smaller noise bandwidth than conventionally switched pyroelectric arrays because, there are no intrinsic offset voltages, and it is possible therefore to incorporate direct bandpass filtering of the signal, as shown in FIG. 2, which could be further enhanced electronically by the use of additional components.

The operational amplifier circuits A1, A2 buffer, filter and amplify the received pyroelectric signal to a workable level for signal processing.

It will be realised by persons skilled in this art that the use of optical switching, rather than electrical switching, eliminates analogue signal corruption related to the effects of charge-injection and charge-sharing caused by transistor switching. This simplifies the early stages of the analogue signal processing and thus enables a certain amount of signal gain to be incorporated.

Figure 3:
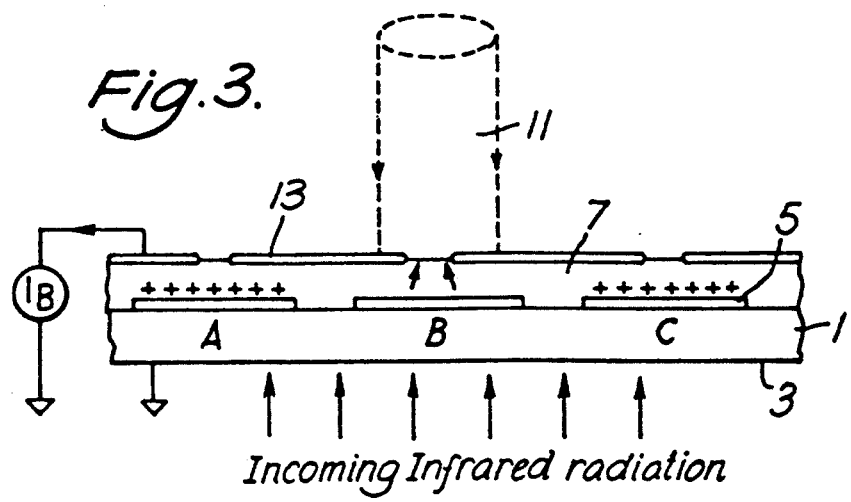
FIG. 3 shows a schematic cross-sectional view of part of a second thermal imaging device in accordance with the present invention.

The arrangement described above illustrates the principle of operation of a device in accordance with the invention. However, as the light beam 11 passes between pixels, there is the possibility of creating lateral conductive pathways between adjacent pixels. This can be obviated quite easily by intermittently switching off or blanking the light source as it traverses or scans between pixels. An alternative and preferred solution however is the provision of a screen having opaque regions arranged to prevent illumination of the photoconductive layer in regions which correspond to the regions of the pyroelectric layer between the detector pixels. This may be accomplished by replacing the transparent collector electrode 9 of FIG. 1 by a perforated opaque (i.e. metallic) collector electrode 13 as described by reference to the second device. This device is shown in FIG. 3 wherein corresponding components have been labelled correspondingly throughout the figures. The perforated electrode 13 ensures that illumination of the photoconductive layer 7 by the source 11, is selectively controlled and hence may form only vertical conductive pathways between the discrete and collector electrodes 5, 13 with no lateral inter-pixel conductive paths. This type of collector electrode arrangement effectively screens against inter-pixel crosstalk.

There remains, however, significant capacitance couple through the photoconductive layer 7 between the discrete electrodes 5 and the collector electrode 13, which could form an a.c. signal pathway to the collector electrode even when the layer 7 is nonconductive.

Figure 4:
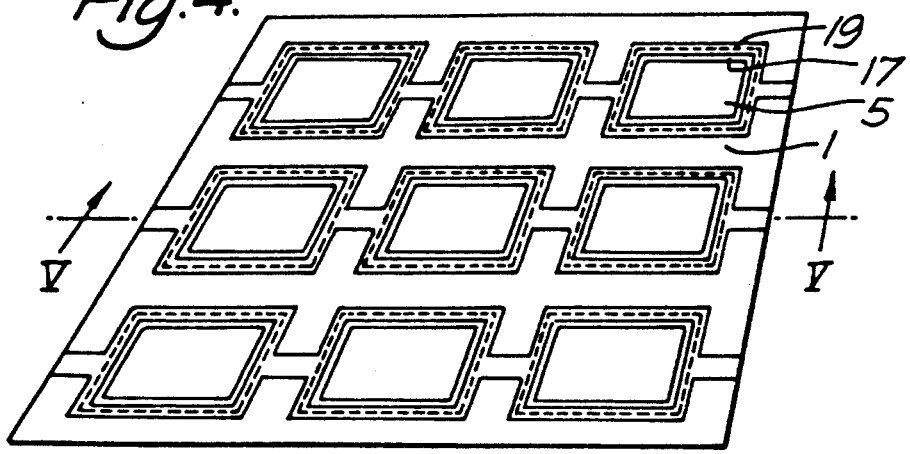
FIG. 4 shows a perspective view of part of a third thermal imaging device in accordance with the present invention.

This latter problems is alleviated in the third device to be described, illustrated in FIGS. 4 and 4. In this device each discrete device electrode 5 is surrounded by a "frame" 17 of photoconductor, the collector electrode 19 being in the form of a complementary matrix of thin film frames, with interconnections 14 of reduced area connecting rows of pixels. The light beam is arranged to scan along the rows, so as to simultaneously illuminate photoconductive frames in a number of different rows as will be described in more detail hereafter. In the prior art, in which transistor switching is used to interrogate each pixel, at least three electrical connections (pixel-reset, pixel-select and row-output bus) and a silicon substrate connection would be required per pixel. However, each pixel in the optically switched matrix of FIGS. 4 and 5 requires only a single photoconductive link to its row-output bus. This is considerably simpler than the known devices and requires far fewer electrical connections. By minimising the area of pixel-to-pixel interconnects, the parasitic capacitive couple from the collector electrodes 19 through the inter-pixel areas of the pyroelectric material to the continual electrode 3 may be reduced, but not totally eliminated.

The fourth device to be described, shown in FIG. 6 and 7, provides a further reduction in the value of the capacitive couple. A collector electrode is provided for each row of pyroelectric detector pixels in the form of adjacent bus-bars 19. Referring to FIG. 7, the discrete electrodes 5 and ground-plane (earthed) electrode tracks 20 are formed on one surface of the pyroelectric layer 1. An insulator layer 17 is deposited on top of the earth-electrode track 20, with "spurs" leading to each pixel edge. A second metal layer is formed over the insulator layer 17 and patterned so as to define an upper bus-bar 19, pixel-connect spur 21 and extension pad 23. The photoconductive layer 7 is patterned into an array of photoconductive regions effective to connect each discrete electrode 5 via the spur 21 and pad 23 to the adjacent upper bus-bar 19. The electrode track 20 is either connected to ground, so as to form a groundplane and isolate the upper bus-bar capacitively from the inter-pixel areas of the pyroelectric material and the continuous electrode 3; alternatively the electrode track 20 may be electrically driven as an "active screen" so as to minimise the overall parasitic capacitance associated with the upper bus-bar 19. The addressing light beam 11 is scanned along the row of photoconductive regions so as to sequentially connect each pixel electrode 5 to the adjacent upper bus-bar 19.

The optical scanning of the pyroelectric matrix as arranged in relation to the third and fourth devices may be achieved by directing a narrow, sub-pixel width, fan-beam across the matrix, orientated normal to the pixel rows and to the device surface and with the fan edge parallel to the pixel columns. A rotating hexagonal mirror, or similar device, or a high speed galvanometer mirror may be employed for this purpose.

Figure 8:
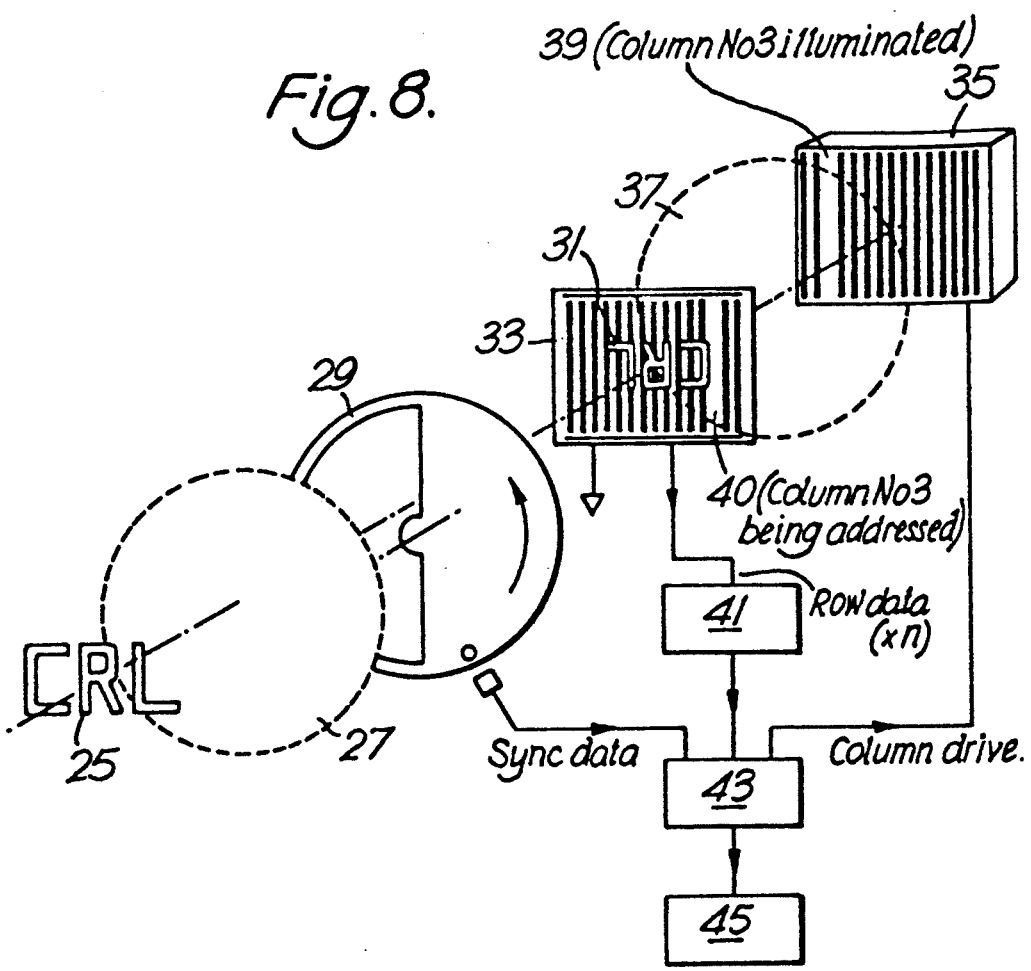
FIG. 8 is a schematic overview of the fourth device illustrating a possible illumination means for a device in accordance with the invention.
Figure 9:
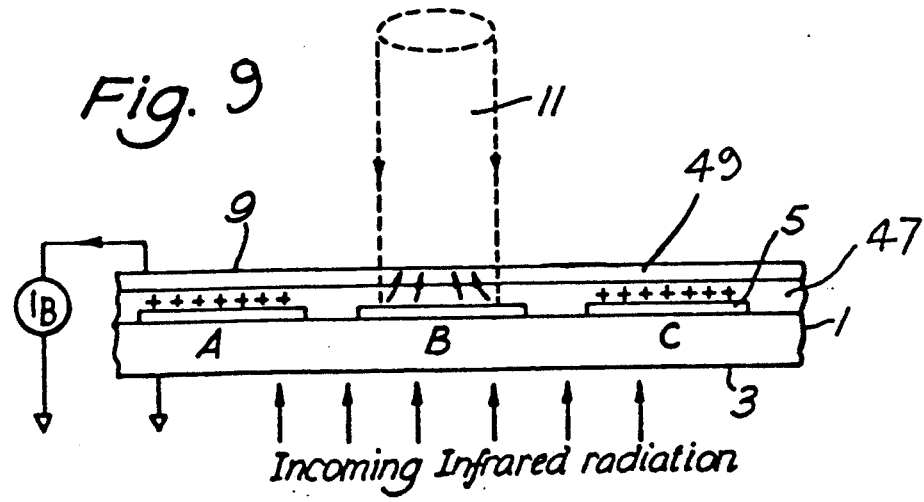
FIG. 9 shows a device in accordance with the invention and incorporating an optically driven Schottky diode photoconductive structure.

Alternatively, the addressing beam or beams 11 may be generated by a simple projection system such as that shown in FIG. 8.

Figure 5:
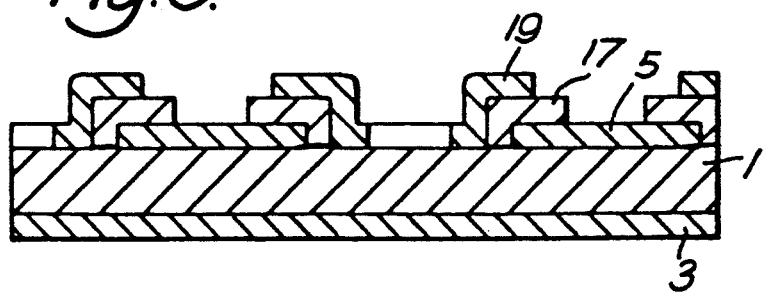
FIG. 5 shows a schematic cross-section along the line V—V of part of the device shown in FIG. 4.

Referring now to FIG. 8, the thermal imaging device incorporates an optically addressable detector array 31, for example of the form shown in FIGS. 6 and 7, or alternatively of the form shown in FIGS. 4 and 5. The device includes an infra-red focussing lens 27 effective to focus an infra-red image of a distant scene 25 onto the continuous electrode structure 3 of the array 31, and a chopper 29 effective to chop the image of the scene 25 so as to be synchronous with the addressing means for the device. The chopper is interposed between the lens 27 and the array 31.

A liquid crystal display matrix 35 produces a scanning illuminated column 39 which, on being focused by a lens 37 and passing through a heat absorbing filter (not shown) is effective to illuminate a corresponding column 40 on the photoconductive layer incorporated in the detector array 31.

The array 31 is effective to produce an analogue electrical signal which is processed by the analogue processing means 41.

This data is then combined with synchronisation information from the chopper 29 and fed into the digital processing means 43 which is also effective to produce the information necessary to drive the sequential illumination of columns of the liquid crystal display matrix 35 so as to scan the display appropriately and synchronously with the chopper.

The digital processing means 43 is also effective to drive the display device 45 to produce an image representative of the distant scene.

It will be appreciated that an alternative form of optically-addressed switch, to the photoconductive layer 7, is an optically-driven reverse-biased Schottky diode structure, such as referred to in "Physics of Semiconductor Devices", S.M. Sze, 1969, pp. 404–409. This may be implemented for example in the device illustrated in FIG. 1 by the deposition of a layer of amorphous silicon 47 in lieu of the photoconductive layer 7, with a layer of aluminium 49 over the silicon forming a non-ohmic contact to the silicon. With an appropriate electrical biasing arrangement of the aluminium layer and with the gold film 9 acting as an ohmic contact, the aluminium/silicon/gold structures will act as photosensitive Schottky diodes.

We claim:

1. A thermal imaging device comprising: first and second electrode structures; a pyroelectric layer arranged between the first and second electrode structures to define an array of pyroelectric detector pixels; a further electrode structure; photoconductive means for electrically coupling one of the first and second electrode structures with the further electrode structure, illumination means for illuminating the photoconductive means by enabling a pyroelectric charge developed by pyroelectric detector pixels to be addressed via the further electrode structure; and screening means incorporating opaque regions for selectively controlling illumination of the photoconductive means for enabling an individual detector pixel to be addressed via said further electrode structure.

2. A thermal imaging device according to claim 1 wherein the illumination means comprises a matrix of liquid crystal display elements for controlling the illumination of the photoconductive means by the illumination means.

3. A thermal imaging device according to claim 1 wherein the illumination means comprises a matrix of liquid crystal display elements for controlling the illumination of the photoconductive means by the illumination means.

4. A thermal imaging device according to claim 1 further comprising chopping means for chopping, at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

5. A thermal imaging device according to claim 1 further comprising chopping means for chopping at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

6. A thermal imaging device comprising first and second electrode structures, a pyroelectric layer arranged between the first and second electrode structures to define an array of pyroelectric detector pixels, a further electrode structure, photoconductive means for electrically coupling one of the first and second electrode structures with the further electrode structure, illumination means for illuminating the photoconductive means by enabling a pyroelectric charge developed by pyroelectric detector pixels to be addressed via the further electrode structure and a screening means incorporating opaque regions for selectively controlling the illumination of the photoconductive means for enabling an individual detector pixel to be addressed via the further electrode structure, wherein the screening means comprises the further electrode structure.

7. A thermal imaging device comprising first and second electrode structures, a pyroelectric layer arranged between the first and second electrode structures to define an array of pyroelectric detector pixels, a further electrode structure, photoconductive means for electrically coupling one of the first and second electrode structures with the further electrode structure, illumination means for illuminating the photoconductive means by enabling a pyroelectric charge developed by pyroelectric detector pixels to be addressed via the further electrode structure, wherein the photoconductive means comprises an array of frame structures of photoconductive material, each frame structure arranged to at least partially surround a respective detector pixel, and the further electrode structure comprises a matrix of electrode frame structures each arranged to at least partially surround a respective detector pixel and complement a frame structure of photoconductive material, the further electrode structure incorporating interconnect portions, having a width substantially less than that of the electrode frame structures, for providing interconnects between adjacent electrode frame structures.

8. A thermal imaging device according to claim 7 wherein the interconnect portions are configured to provide electrode frame structures arranged in rows and the illumination means is arranged to scan in a manner so as to simultaneously illuminate a plurality of frame structures of photoconductive material each complementing an electrode frame structure in a different row for enabling a plurality of detector pixels to be addressed simultaneously by the illumination means.

9. A thermal imaging device according to claim 7 wherein the illumination means comprises a matrix of liquid crystal display elements for controlling the illumination of the photoconductive means by the illumination means.

10. A thermal imaging device according to claim 7 further comprising chopping means for chopping, at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

11. A thermal imaging device comprising first and second electrode structures, a pyroelectric layer arranged between the first and second electrode structures to define an array of pyroelectric detector pixels, a further electrode structure, photoconductive means for electrically coupling one of the first and second electrode structures with the further electrode structure, illumination means for illuminating the photoconductive means by enabling a pyroelectric charge developed by pyroelectric detector pixels to be addressed via the further electrode structure, wherein said one electrode structure overlies first regions of the pyroelectric layer and the photoconductive means and the further electrode structure are arranged to overlie further regions of the pyroelectric layer, spaced from the first regions, the device further comprising electrical conductors, spaced from the pyroelectric layer, for providing an electrical path between the said one and the further electrode structure, and a grounding electrode structure, isolated electrically from the further electrode structure and arranged between the further electrode structure and the pyroelectric layer for capacitively isolating the further electrode structure from the pyroelectric layer.

12. A thermal imaging device according to claim 11 wherein the said one electrode structure provides a plurality of discrete electrodes arranged as an array of rows and columns on a major surface of the pyroelectric layer, the further electrode structure and the grounding electrode structure each comprising a respective plurality of elongate strip electrodes, each elongate strip further electrode being arranged to overlie an elongate strip grounding electrode and spaced therefrom by an electrical insulator layer, and wherein the photoconductive means comprises a plurality of discrete regions of photoconductive material, each respective to a discrete electrode of said one electrode structure and connected thereto by a said electrical conductive, the regions of photoconductive material overlying the elongate strip further electrodes.

13. A thermal imaging device according to claim 11 wherein the illumination means comprises a matrix of liquid crystal display elements for controlling the illumination of the photoconductive means by the illumination means.

14. A thermal imaging device according to claim 11 further comprising chopping means for chopping, at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

15. A thermal imaging device comprising first and second electrode structures, a pyroelectric layer arranged between the first and second electrode structures to define an array of pyroelectric detector pixels, a further electrode structure, photoconductive means for electrically coupling one of the first and second electrode structures with the further electrode structure, illumination means for illuminating the photoconductive means by enabling a pyroelectric charge developed by pyroelectric detector pixels to be addressed via the further electrode structure wherein the illumination means comprises a matrix of liquid crystal display elements for controlling the illumination of the photoconductive means by the illumination means and further comprising chopping means for chopping, at a chopping frequency, infra red radiation incident on the device and synchronising means for providing reference pulses at a frequency corresponding to the chopping frequency for synchronising illumination of the photoconductive means by the illumination means such that every detector pixel is addressed optically at time intervals determined by the reference pulses.

16. A thermal imaging device comprising first and second electrode structures, a pyroelectric layer arranged between the first and second electrode structures to define an array of pyroelectric detector pixels, a further electrode structure, photoconductive means for electrically coupling one of the first and second electrode structures with the further electrode structure, illumination means for illuminating the photoconductive means by enabling a pyroelectric charge developed by pyroelectric detector pixels to be addressed via the further electrode structure and the photoconductive means comprises a Schottky diode structure for connection in a reverse-bias mode for enabling operation as an optically driven switch.

* * * * *